United States Patent
Guzman et al.

(10) Patent No.: US 9,690,884 B2
(45) Date of Patent: Jun. 27, 2017

(54) WIND FARM PREDICTION OF POTENTIAL AND ACTUAL POWER GENERATION

(71) Applicant: WindLogics Inc., Juno Beach, FL (US)

(72) Inventors: Francisco Guzman, Roseville, MN (US); Brian D. Martin, Tequesta, FL (US); Ian Fiske, Jacksonville, FL (US); Timothy D. Stovall, Jupiter, FL (US); Dennis A. Moon, Grand Rapids, MN (US); Joseph D. Williams, Boca Raton, FL (US); Richard Walker, Jr., Stuart, FL (US)

(73) Assignee: WINDLOGICS INC., Juno Beach, FL (US)

(*) Notice: Subject to any disclaimer, the term of this patent is extended or adjusted under 35 U.S.C. 154(b) by 621 days.

(21) Appl. No.: 14/295,790

(22) Filed: Jun. 4, 2014

(65) Prior Publication Data

US 2014/0365187 A1    Dec. 11, 2014

Related U.S. Application Data

(60) Provisional application No. 61/831,221, filed on Jun. 5, 2013.

(51) Int. Cl.
| | |
|---|---|
| *G06F 17/50* | (2006.01) |
| *F03D 7/04* | (2006.01) |
| *F03D 17/00* | (2016.01) |

(52) U.S. Cl.
CPC ......... *G06F 17/5009* (2013.01); *F03D 7/048* (2013.01); *F03D 17/00* (2016.05); *Y02E 10/723* (2013.01)

(58) Field of Classification Search
USPC .............. 703/2, 18; 700/291, 297; 322/38
See application file for complete search history.

(56) References Cited

U.S. PATENT DOCUMENTS

| | | |
|---|---|---|
| 7,363,808 B2 | 4/2008 | Ormel et al. |
| 7,909,575 B2 | 3/2011 | Barbu et al. |
| (Continued) | | |

FOREIGN PATENT DOCUMENTS

| | | |
|---|---|---|
| EP | 2120204 A1 | 11/2009 |
| EP | 2128438 A2 | 12/2009 |
| EP | 2232667 B1 | 1/2013 |

OTHER PUBLICATIONS

International Search Report in International Application No. PCT/US2014/041044, European Patent Office, NL, mailed Sep. 18, 2014.

(Continued)

*Primary Examiner* — Thai Phan
(74) *Attorney, Agent, or Firm* — Feldman Gale, P.A.

(57) ABSTRACT

A system and method is disclosed for calculating potential power generation for a wind farm, the wind farm including a plurality of wind turbines. The system and method include measuring the power generated by the wind farm; acquiring turbine data from at least a subset of the plurality of wind turbines, the wind turbine data including local wind speed and power generated at the local wind speed; acquiring wind resource data for the wind farm, the wind resource data including wind speed; generating a power curve from the turbine data and the wind resource data, the power curve plotting the relationship between wind speed and power generated; calculating power lost due to availability, sub-curve, and curtailment, the power loss calculated for at least said subset of turbines; and aggregating the power lost in order to determine an aggregate power loss for the wind farm.

20 Claims, 5 Drawing Sheets

(56) References Cited

U.S. PATENT DOCUMENTS

| | | | |
|---|---|---|---|
| 7,994,658 B2 | 8/2011 | Cardinal et al. | |
| 8,244,406 B2* | 8/2012 | Momoh | G06Q 10/06 700/286 |
| 8,257,040 B2 | 9/2012 | Chen et al. | |
| 9,002,761 B2* | 4/2015 | Montalvo | G06Q 10/06 322/38 |
| 2010/0268579 A1* | 10/2010 | Momoh | G06Q 10/06 705/14.1 |
| 2011/0224926 A1 | 9/2011 | Morjaria et al. | |
| 2012/0065805 A1* | 3/2012 | Montalvo | G06Q 10/06 700/297 |
| 2012/0101644 A1 | 4/2012 | Evans et al. | |
| 2012/0230821 A1 | 9/2012 | Hou et al. | |
| 2013/0166084 A1* | 6/2013 | Sedighy | G06Q 50/06 700/291 |
| 2014/0172503 A1* | 6/2014 | Hammerstrom | G06Q 30/0206 705/7.31 |

OTHER PUBLICATIONS

Written Opinion of the Isa in International Application No. PCT/US2014/041044, European Patent Office, NL, mailed Sep. 18, 2014.

\* cited by examiner

FIG. 4
|             | Plan MWh  | MWh       | Delta MWh |
|-------------|-----------|-----------|-----------|
| Net         | 19,350.60 | 20,006.49 | 655.89    |
| Electrical  |           | 316.14    |           |
| Availability| 310.24    | 1,230.12  | 919.88    |
| Subcurve    |           | 223.58    |           |
| Curtailment | 48.00     | 9.28      | -38.72    |
| Gross       | 19,708.84 | 21,785.61 | 2,076.77  |
| Wind Resource |         | 1,829.94  |           |
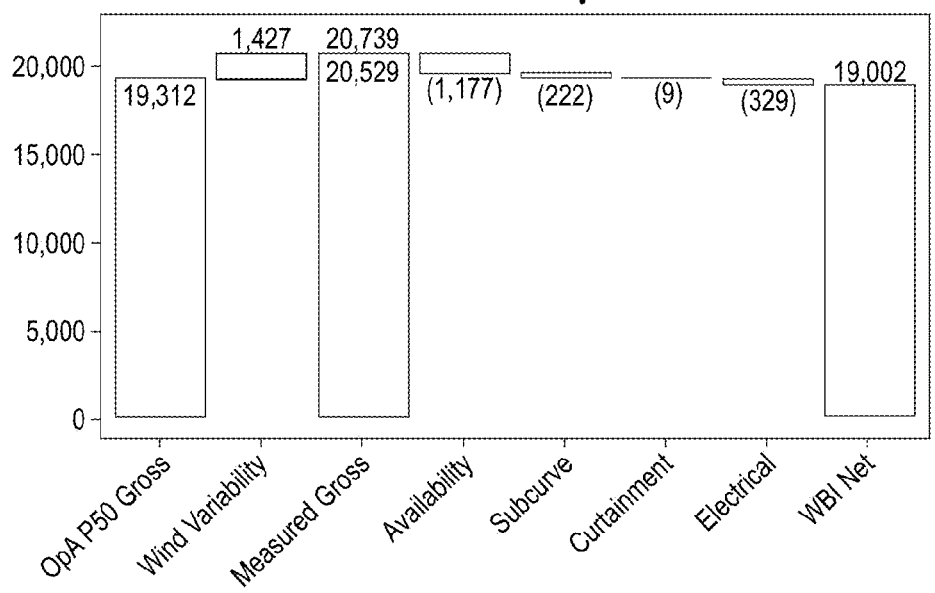
FIG. 5 Intramonth Report
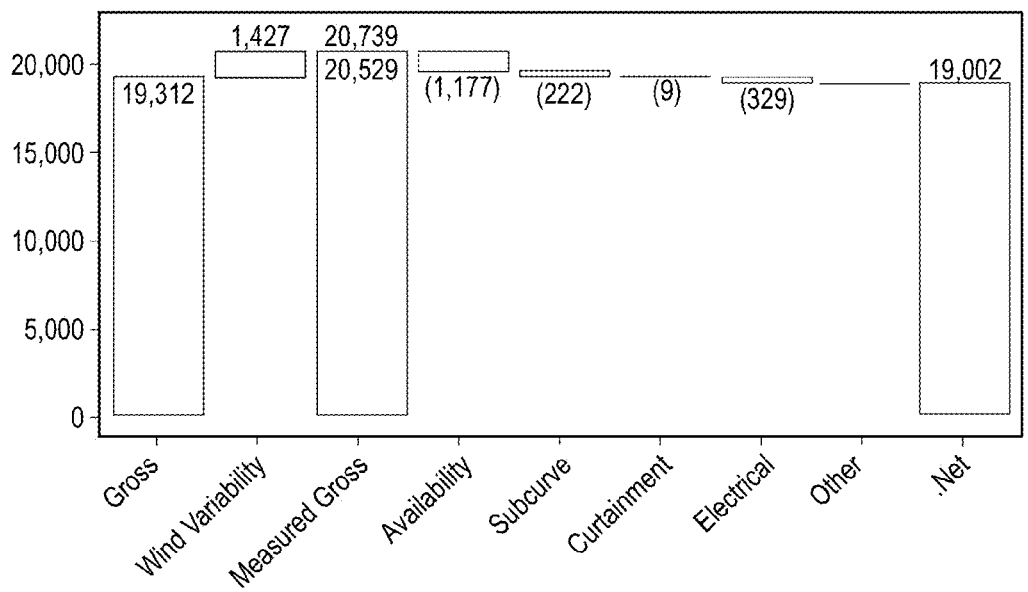
FIG. 6 End of Month Report

WIND FARM PREDICTION OF POTENTIAL AND ACTUAL POWER GENERATION

CROSS REFERENCE TO RELATED APPLICATIONS

This application claims the benefit of U.S. Provisional Patent Application No. 61/831,221, filed Jun. 5, 2013, the disclosure of which is hereby incorporated by reference in its entirety.

FIELD OF THE INVENTION

The invention generally relates to power generation. More specifically, the invention relates to the use of numerical models to predict power generation by wind farms.

BACKGROUND

Wind turbine technology is providing an ever-increasing proportion of the electrical energy generated in the United States and worldwide. Wind turbines transform kinetic energy, provided by a wind source, into mechanical energy, which may in turn be used to produce electricity. The kinetic energy sourced from the wind may be referred to as wind energy, and the converted mechanical energy may be referred to as wind power. In order to harvest a sufficient amount of wind energy thereby producing a sufficient amount of wind power, a plurality of wind turbines may be arranged in a wind farm. Wind farms have become increasingly popular, due in part to the ability to generate electricity without producing pollution or consuming water, and are increasingly relied upon for high volume electricity generation.

Generators which utilize ecologically friendly "green" technologies, such as wind, solar, or hydro power, are inherently reliant on local environmental conditions in order to generate a sufficient quantity of electricity. In the case of wind turbine technology, the amount of energy produced by a wind turbine is directly related to wind resource which may be defined as meteorological or environmental conditions determined by meteorological variables such as wind speed and air density. The wind resource available may also substantially control the amount of power a wind turbine is able to produce. For example, the local wind speed and air density will affect the amount of force exerted onto the wind turbine blades, which in turn may affect the maximum power output of the wind turbine. In a wind farm, environmental conditions may vary from turbine to turbine. The localized variation in wind energy available is particularly significant in expansive farms which cover a large amount of terrain. Wind gusts, pockets of air pressure change, or other localized differences in environmental conditions should be accounted for when predicting wind power which may be generated by a wind farm.

Wind energy has a long history of technology improvements that drive increased energy generation with reduced cost. A method is needed to evaluate the performance of a wind turbine by quantifying the potential energy generation of a given turbine with a given wind resource. In order to evaluate and improve both the efficiency of wind turbines, as well as to evaluate the desirability of developed turbine technology, a method or system for determining potential wind power which may be generated but is lost during electricity generation is needed.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In one embodiment of the disclosure, a method is provided for calculating potential power generation for a wind farm that may include a plurality of wind turbines. The method may include the steps of measuring the power generated by the wind farm; acquiring turbine data from each of the plurality of wind turbines, the wind turbine data including measured local wind speed and power generated at each local wind turbine; acquiring wind resource data, for example regional weather data for the wind farm, the regional weather data including air density; generating a power curve from the turbine data and the local wind speed and regional weather data, the power curve describing the functional relationship between wind speed, air density, and power generated; calculating power lost due to availability, subcurve, and curtailment, the power loss being calculated for each turbine; and aggregating the power loss in order to determine the power loss for the wind farm.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of illustrative embodiments of the invention when considered in conjunction with the drawings.

BRIEF DESCRIPTION OF THE FIGURES

FIG. 4 illustrates a data table for generating the energy production report of FIG. 3 in accordance with one embodiment of the disclosure;

FIG. 5 illustrates an abbreviated intra-month report in accordance with an embodiment of the disclosure;

FIG. 6 illustrates an abbreviated end of the month report in accordance with an embodiment of the disclosure.

DETAILED DESCRIPTION OF ILLUSTRATIVE EMBODIMENTS

Figure 1:
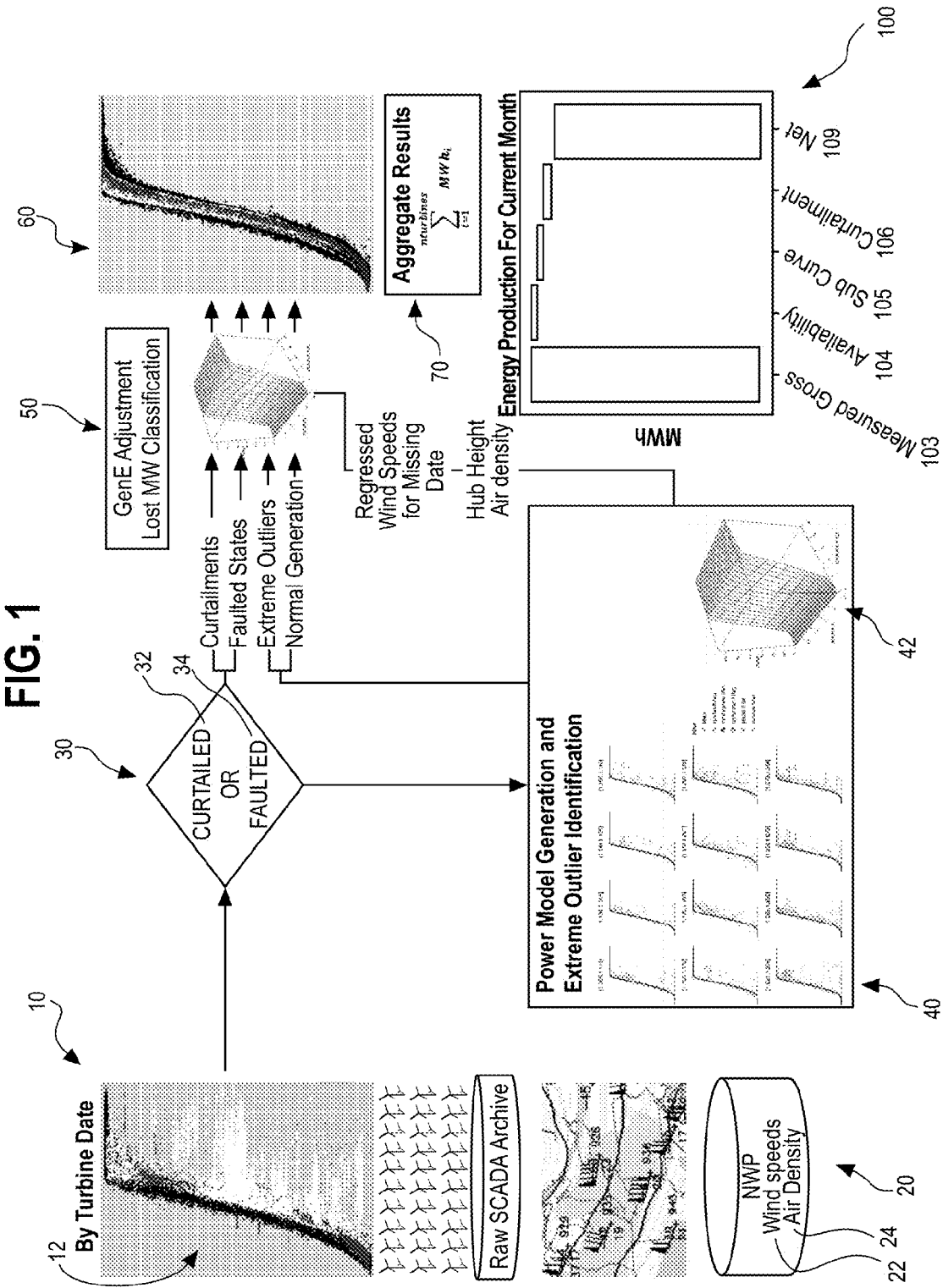
FIG. 1 illustrates a flow chart detailing an embodiment of a power generation prediction process of the disclosure.

The following detailed description and the appended drawings describe and illustrate exemplary embodiments of the invention ("embodiments" or "examples") solely for the purpose of enabling one of ordinary skill in the relevant art to make and use the invention. It is to be understood that the embodiments may be combined or that other embodiments may be utilized, and that structural, logical, and electrical variations may be made without departing from the scope of the subject matter disclosed herein. As such, the detailed description and illustration of these embodiments are purely exemplary in nature and are in no way intended to limit the scope of the invention, or its protection, in any manner. The following detailed description is, therefore, not to be taken in a limiting sense, and the scope of the subject matter disclosed herein is defined by the appended claims and their equivalents. It should also be understood that the drawings are not to scale and in certain instances details have been omitted, which are not necessary for an understanding of the present invention, such as conventional details of fabrication and assembly.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. In this document, the term "or" is used to refer to a nonexclusive or, unless otherwise indicated.

The various embodiments and/or components, for example, the modules, elements, or components therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software", "firmware" and "algorithm" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

With reference now to FIG. 1, a flow chart illustrating an embodiment of the disclosure for quantifying the potential power production of a wind farm as well as calculating the wind power lost begins with the collection of turbine data 10 and wind resource data 20 that may include air density data from a regional weather database. Wind resource data may be defined as meteorological or environmental data associated with wind energy generation; specifically but not limited to, wind speed and air density data which may be obtained from a regional weather database. In one embodiment, the generation of power curves involves processing of the air density data from such wind resource data. Wind resource data may be provided by a numerical weather prediction model, for example, or may be acquired from a regional weather database. In the illustrated embodiment, turbine data 10 may be acquired through a centralized control system, which for instance may be a supervisory control and data acquisition ("SCADA") system, which is a type of industrial control system utilized in the turbine technology industry, as well as other industrial process industries. Turbine data 10 may be collected by the SCADA system in relation to at least one wind turbine and, in some embodiments, a plurality of wind turbines which are arranged in a wind farm. In one embodiment, the turbine data 10 is collected from turbine nacelle anemometers, however it should be understood and appreciated that the present disclosure contemplates the SCADA system utilizing other known or to be developed sensors, meters, and other measurement devices necessary for acquiring turbine data 10 for each of the one or more turbines to be analyzed. For example, turbine data 10 may include local air density data.

The turbine data 10 may include a collection of raw data regarding power generated at one or more turbines in the wind farm, measured for instance in kilowatts, and localized wind speed at each analyzed turbine, measured, for instance, in meters per second. A raw wind power curve 12 may be generated and modeled from turbine data 10 showing the relationship between power generated and wind speed across the one or more turbines. As illustrated, wind power may be plotted along the vertical axis while wind speed may be plotted along the horizontal axis. The resulting generated raw wind power curve 12 generally follows the curvature of wind power curves known to persons of ordinary skill in the art. The wind power curve 12 for a variable-speed, variable-pitch wind turbine may include three phases: 1) at low wind speeds, the curve is flat at zero power where wind speeds are not sufficient to generate energy; 2) a steep sloped region where power is proportional to the cube of the wind speed; and 3) the curve is flat at rated power where the turbine has reached design limits and no longer produces additional power with additional wind speed. The turbine may operate in phase three by pitching the blades to spill wind and reduce its ability to generate power. A raw wind power curve 12 may be generated from turbine data 10 collected in real time over a given time period, one hour or less for example. The illustrated embodiment features turbine data 10 over a ten minute archive of SCADA collected data points from a wind farm. In one embodiment, the time period should be sufficiently long in order to collect enough data to statistically characterize normal power output as a function of wind speed and air density.

Discrepancies and errors in turbine data 10 are visible in the illustrated raw wind power curve 12 shown in FIG. 1. These include situations when the power output of the turbine for the locally-observed wind speed and historical air density data is inconsistent with a statistical characterization of previous performance. This may arise from a number of causes such as curtailment, mechanical issues, icing build-up, anemometer malfunction, etc. Although the turbine data 10 may be generally plotted as following known wind power curves, best shown by the most concentrated collection of data points along raw power curve 10, illustrated as the darkest portions of the curve, a significant portion of data points fall well off the curve. Generally, data points which indicate substantially less power for a given wind speed, as compared to most other data points, can be considered power lost from the potential power which could have been generated under more optimal conditions or performance.

The SCADA system may be utilized in a first filtering step 30 to identify and, ultimately, remove energy production associated with certain sources of power loss such as curtailment 32 and availability 34. Power loss due to curtailment 32 occurs where turbines at the given asset are actively spilling wind. Curtailment 32 instances may be identified in the filtering step 30 through curtailment tags in the SCADA system and by algorithmically examining the turbine blade angle data for instances where blades pitch earlier than their normal spill at the rated power. Power loss due to availability 34 occurs where turbines at a given asset are in a faulted state as defined by the SCADA system and either producing no power or consuming more power than produced. Availability is not necessarily a measurement of Equivalent Forced Outage Rates (EFOR) but rather may encompass all faulted states where no power is being produced by a particular turbine.

The SCADA system has a limited ability to predict power generation potential due to some sources of power loss. For instance, a SCADA system may tag turbine data 10 associated with a turbine operating in a fault state as associated with availability 34. The SCADA may also identify and tag turbine data 10 associated with curtailment 32, as discussed above. However, a significant disadvantage to utilizing the SCADA system alone in a power generation prediction process is that it may account for only two sources of power generation loss.

A third, significant source of power generation loss, subcurve 105, includes turbine performance-related losses that cannot be classified as either curtailments or availability. Subcurve 105 may be defined as the energy derived from data points that fall below what has been determined to be normal operations specific to each turbine. This data may be made up of points that are in a faulted state but still producing power, as opposed to availability which is data from faulted states where no power is being produced or power is being consumed by the turbine. Subcurve, thus, includes sources of power generation losses which occur while the turbine is operating in a "normal state," that is, losses reflected or occurring in turbine data which the SCADA system did not identify and tag as attributed to a faulted or curtailed state.

One example instance of subcurve power loss may include lost power generation due to delay in turbine blade pitch adjustment to gusting or lulling winds, which may be a source of power loss in wind turbines and which may be unaccounted for in the SCADA system alone but may be identified in a power generation loss prediction process in accordance with the present disclosure. Turbines in wind farms presently utilize known programs or processes for automatically adjusting blade pitches in response to sudden changes in wind speed. Because the adjustment to wind change is not instantaneous, there often is lost potential power generation due to the inability of the turbine blades to instantaneously adjust to wind speed shifts. Because these kind of power losses occur during "normal operation" of the turbine, these losses may not be identified by the SCADA system and, as such, remain unaccounted for in the process for determining power generation loss that utilize the SCADA system alone. Additional examples of power loss accounted for by subcurve, which may be unaccounted for in the SCADA system alone, includes but are not limited to: icing of turbines or turbines blades, as well as other performance affected by other weather phenomena; asymmetry in turbine blade designs; wind vane or blade pitch misalignment; sensor degradation; blade soiling, pitting, or chipping; turbine de-rating which might not be associated with flagged curtailment 32; exceeding of design limit criteria set forth by an original equipment manufacturer (OEM); and OEM programming errors in SCADA software. Additionally, another disadvantage of using data solely attributable to turbine data 10 is that the SCADA system may fail to consider wind resource data 20, and may further utilize data which may include gaps or outliers due to errors described above, such as errors in the measurement instruments.

Wind resource data 20 may be comprised of meteorological data provided by a numerical weather prediction model which includes, in the illustrated embodiment, measurements of wind speed data 22 and air density data 24. Although wind speed measurements may be calculated locally at each turbine as part of turbine data 10, wind speed data 22, in the form of an analysis (not necessarily a forecast) from archived data provided by various national weather data providers, may further be provided as a measurement across the entire wind farm. Gaps in wind speed data from turbine data 10 may occur for a variety of reasons including, but not limited to, communication errors or statistical filtering. Wind speed data 22 from the analyses used to initialize numerical weather prediction models may be regressed against available wind speeds from devices collecting turbine data 10, such as a turbine nacelle-mounted anemometer, in order to backfill missing turbine data 10. Accordingly, by mutually utilizing turbine data 10 and wind resource data 20, a complete time series of wind speed and air density for each turbine may be made available as generated by a process in accordance with the disclosure. Accordingly, a process in accordance with embodiments of the disclosure may generate a fully-populated time series of data in generation step 60 in order to determine potential energy production during the given time series of wind speed and air density. In the illustrated embodiment of a power generation prediction process, air density is provided by wind resource data 20 from the numerical weather prediction model; however it should be understood and appreciated that air density measurements may be additionally provided as part of turbine data 10 or through a separate data acquisition process.

Utilizing wind resource data 20 and turbine data 10, robust statistical regression methods may be used to create a power model and identify extreme outliers in step 40 as part of the process of the disclosure. Utilizing wind speed data 10 and 22 and air density data 24, an implied power surface 42, having variable density and variable wind speed, may be generated in order to illustrate the relationship between wind speed and power generation versus air density, plotted as "rho" along the z-axis in the embodiment illustrated in FIG. 2. As the relationship between wind speed, air density, and energy production tends to be unique for each turbine, an implied power surface 42 may be plotted for each turbine. An implied power surface 42 may be built, as shown in the illustrated embodiment, excluding energy production associated with curtailments and availability, as identified and removed from in filtering step 30, as well as excluding data identified as statistically extreme outliers. By using data collected over a sufficiently long period to represent a full range of wind speed and air density conditions, a variable-density power curve may characterize the expected power output for any time of the year.

After variable-density and variable-wind speed power surface 42 is plotted in accordance with the disclosure, the process may further include an adjustment step 50 for points previously filtered, and a generation step 60 for determining power loss at each turbine in a wind farm. The adjustment step 50 may use the fully populated time series of wind resource from 10 and 20 to calculate the expected power generation using the variable-density power surface 42. The generation step 60 calculates the energy by taking the difference between the expected generation 50 and the actual power generation reported by SCADA 12 for each data point identified as curtailment, availability, or subcurve. In an aggregation step 70, the potential energy production for each turbine is cumulated or summed together to determine the potential energy production for the wind farm.

Figure 2:
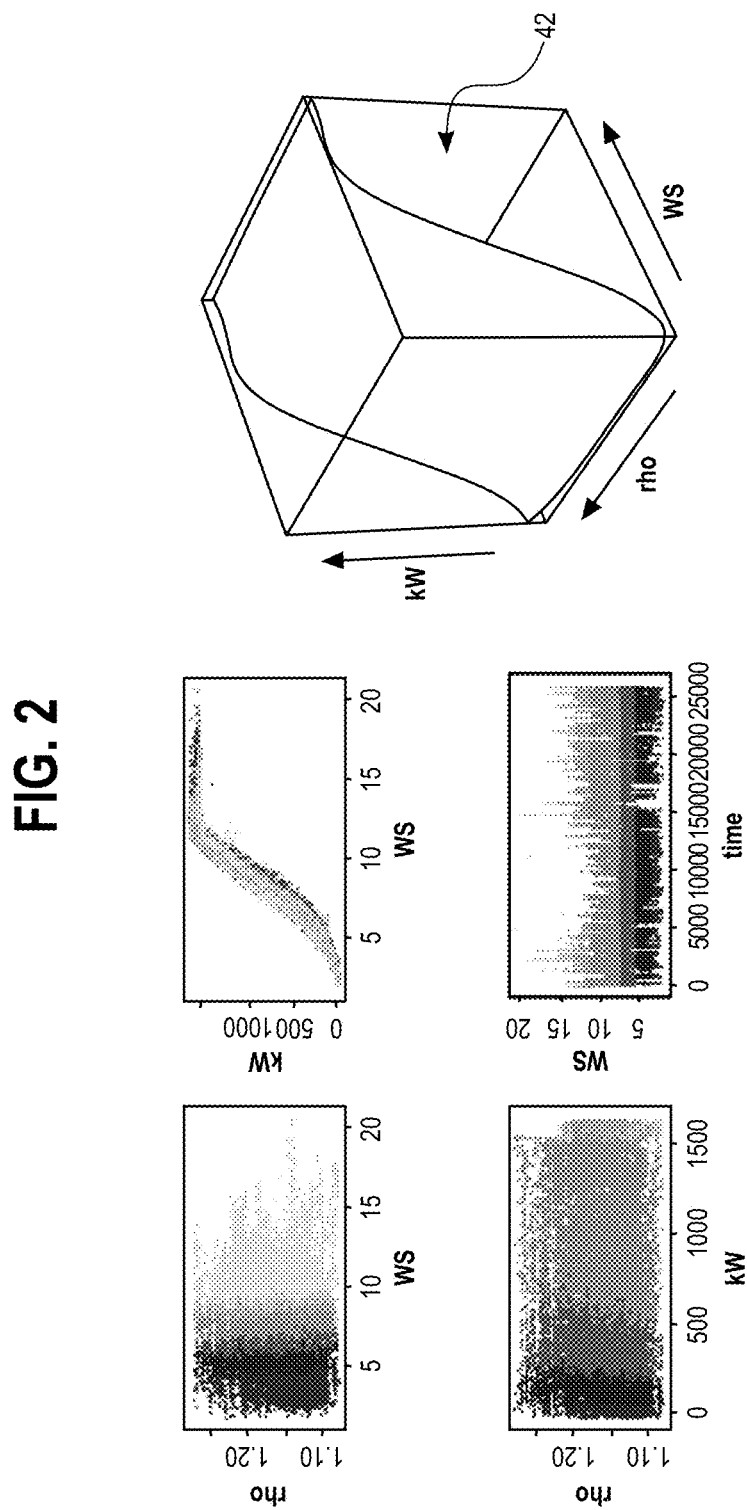
FIG. 2 illustrates a pre-adjusted, multi-density curve utilized in the process of FIG. 1 in accordance with an embodiment of the disclosure.

FIG. 2 illustrates an exemplary creation of implied power surface 42 using turbine-specific turbine data 10. A series of plots illustrating collected turbine data 10 in accordance with an embodiment of the disclosure is illustrated. Turbine data may be plotted to illustrate relationships between wind speeds ("ws"), air density ("rho"), power generated ("kw"), and time. Other embodiments contemplated within the disclosure from which report 100 may be generated include, but are not limited to: omitting a step of outlier detection; omitting the implied power curve and use an OEM power curve instead; use of wind farm aggregated data instead of turbine-specific data, thereby generating a power curve for the whole wind farm; and omitting air density data and generate data only using wind speed. In addition to, or instead of, generating report 100, data collected may be utilized to determine efficiency for comparison to other turbines, either within or outside the wind farm.

Figure 3:
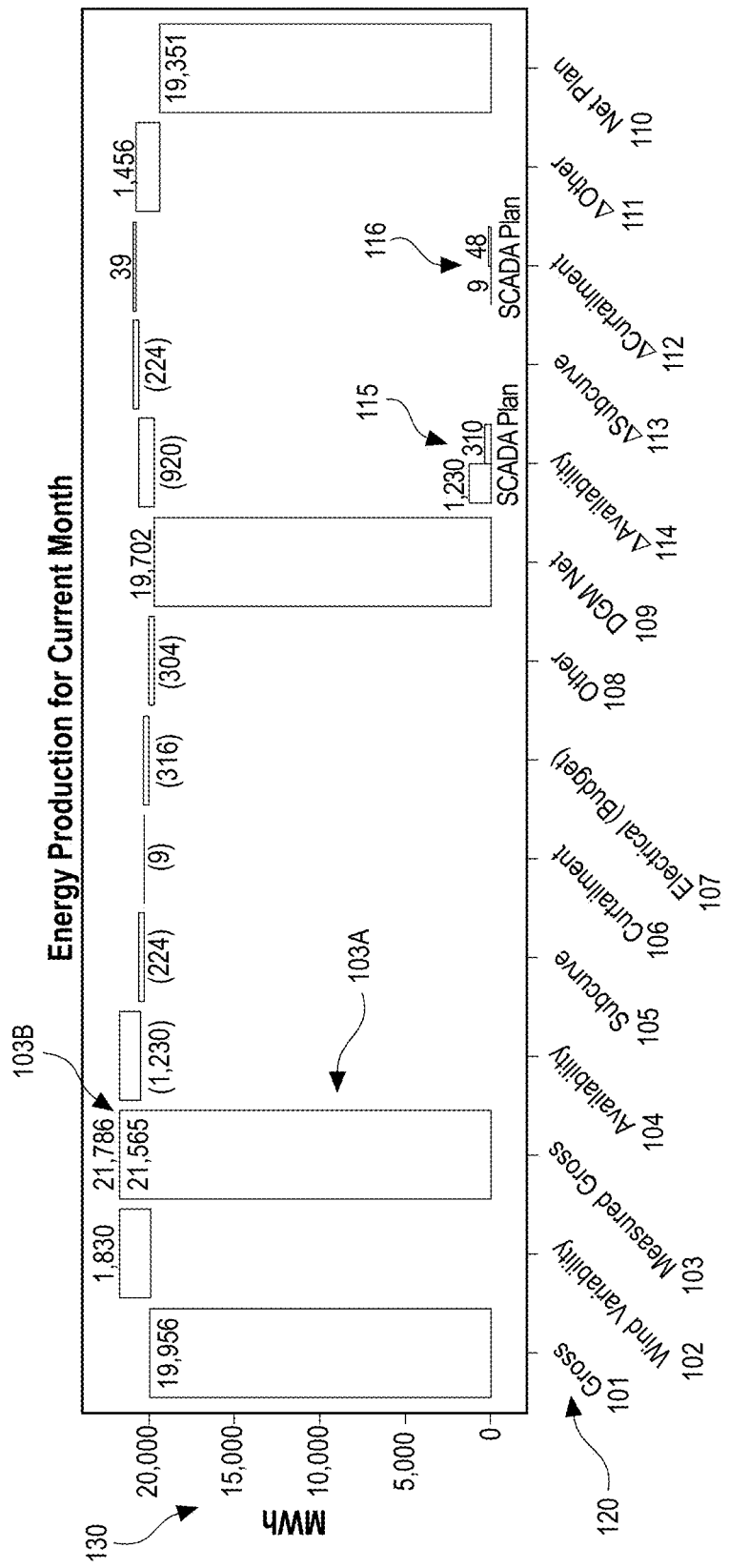
FIG. 3 illustrates an energy production report in accordance with the process of FIG. 1 in accordance with an embodiment of the disclosure.

With reference now to FIGS. 1 and 3, the aggregate results acquired through aggregation step 70 may then be charted or displayed in a wind farm power generation loss report 100, thereby providing a visual display quantifying the potential production of a wind farm given the available wind resource. In the embodiment illustrated in FIG. 3, the report 100 is charted in a waterfall or modified bar chart, however other known or to be developed charting methods including, but not limited to, pie, chart, or diagrams charts are contemplated within the disclosure.

As best illustrated in FIG. 3, after aggregating results in step 70, a report 100 may be generated and published to show power production, expected power generation, as well as sources of power loss determined through a process in accordance with the disclosure. In the illustrated embodiment of report 100, various power generation or sources of loss 120 are calculated along the horizontal axis in power units of Mega-watt hours (MWh) (130). A long term estimate of expected power generation 101 is charted for the given month. This first quantity 101 may then be compared to a second quantity 103, which is calculated using a power prediction process described herein in accordance with an embodiment of the disclosure. First quantity 101 may be associated with known or to-be developed processes to be compared to a process in accordance with the disclosure. The second power prediction method 103, charted in the illustrated embodiment as "measured gross" or measured gross power that is power expected to be generated by the wind farm given the wind resource, illustrates the amount of power which could have been generated if no losses occurred. Two quantities of predicted power generation from second process 103 may be charted, with the bottom bar 103A illustrating the sum of all measurable and classifiable data from the captured SCADA, while the quantity stacked in the top bar 103B illustrates the additional power determined from missing data back-filled during adjustment step 50, in accordance with the disclosure. The summation of quantities 103A, 103B represents the total amount of power which could have been generated. The difference between first and second quantities 101, 103 may be calculated and charted as an indicator, for instance, of wind variability 102.

Power losses due to availability 104, subcurve 105, and curtailment 106, which are described above and calculated through a process in accordance with the disclosure, may be charted to illustrate sources of potential power generation loss. An additional electrical loss 107 may be calculated in report 100. Electrical loss 107 may include power loss unassociated with the ability of the wind farm turbines to harvest the maximum amount of wind resource, such as system collection and generation losses. The actual power produced 109 is also charted in the report, and other losses 108 not accounted for in losses 104-107 may be illustrated.

Budgeted or planned power generation 110 for the given month is also charted on the right side of illustrated embodiment of report 100. Planned power generation 110 may be calculated using prediction models, for instance calculated using regression modeling or other known or to be developed software, from previous months. As shown in FIG. 4 for instance, and charted in FIG. 3, planned or budgeted power generation 110 may also include planned or budgeted losses due to fault states 114, shown as availability, as well as curtailment states 112. Differences between planned and calculated losses due to availability 115 and curtailment 116 may also be calculated and plotted as a subchart to be included in report 100. Also charted in the illustrated embodiment of report 100 are differences in subcurve 113 losses as well as other losses 111 not budgeted for the given month. As a result of these charts, report 100 should assist a user of a process in accordance with the disclosure in adjusting future budgeted power generation as well as budgeting future anticipated losses.

Report 100 may be auto published daily, weekly, at the end of each month, or at any other periodic time as desired by a user of an embodiment of the process in accordance with the disclosure. In some embodiments, report 100 may be manually generated at an irregular interval, at the immediate request of a user of the process. For instance, a user may request wind resource data 20 and turbine data 10 be immediately populated over a time-interval and subsequently generated into report 100. FIGS. 5 and 6, for instance, illustrate embodiments of the disclosure showing abbreviated or condensed reports for intra-month 100A and end of month 100B time intervals. The illustrated embodiment of abbreviated reports 100A, 100B do include analysis of the budget power generation 110. It should be noted and appreciated that in this embodiment of condensed reports 100A, 100B, an "Other" bucket is generated only for end of month condensed report 100B. Furthermore, net power in the intra-month report 100A may be estimated, while the end of month report 100B may illustrate the actual power consumption.

Figure 7:
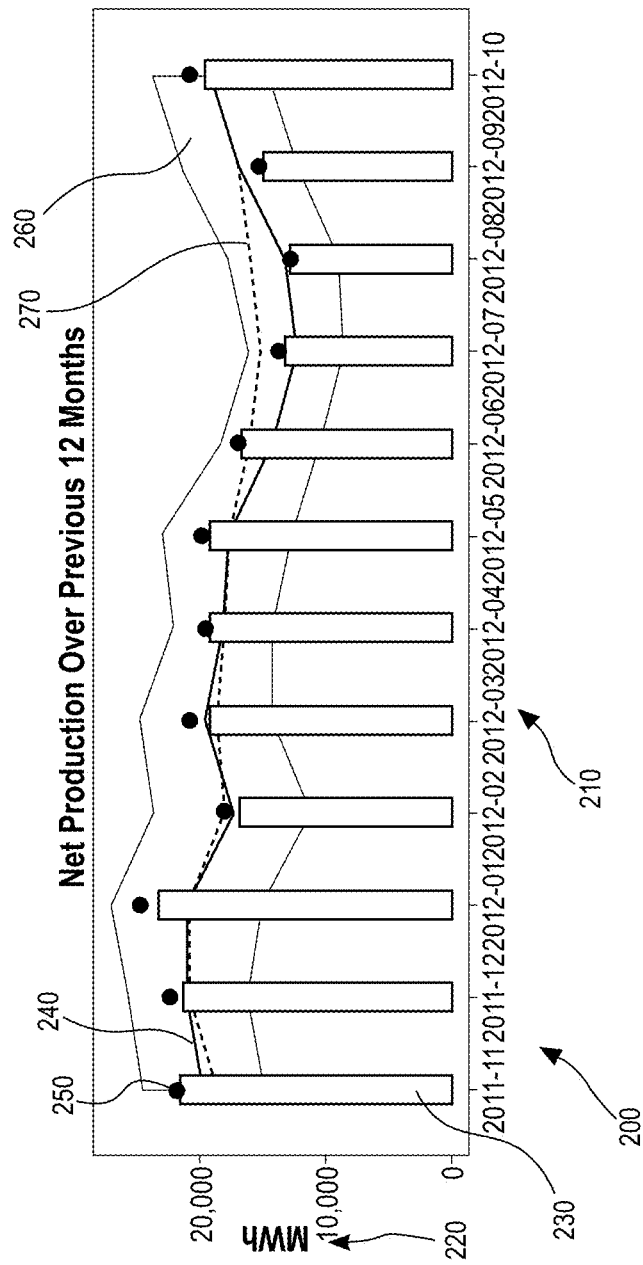
FIG. 7 illustrates a periodic energy production report in accordance with an embodiment of the disclosure.

FIG. 7 illustrates a tracking chart 200 which may graph, plot, or chart periodic power production over a to-be determined time interval. In the illustrated embodiment of tracking chart 200, net power production is charted on a month-to-month interval, with the horizontal access plotting the associated month 210 and the vertical access plotting the power generated 220, in this case as measured in MWh. Several data outputs may be tracked in a single chart 200. In the illustrated embodiment, month to reporting of actual power generated 230, expected power generation based on a first process 101, 240, expected power generation based on a second process 103, 250 in accordance with the disclosure, as well as an error range 260 of either the first or second method 240, 250 of expected power generation using known statistical analysis methods of data. A determined power budget 110, 270 may also be charted. In the illustrated embodiment, the statistical error range 260 is provided for the first process 101, 240. Tracking chart 200 thereby illustrates for a user the accuracy of predictive power budgeting 270, as well as month-to-month comparison of first and second processes 101, 103. It should be appreciated that reports 200 having reporting intervals 210 different than month-to-month, such as week-to-week or day-to-day, are contemplated within the disclosure. It should also be appreciated that power generation 220 may alternatively be plotted as a percentage of power achieved versus power expected, utilizing the various embodiments of the process in accordance with the disclosure, as opposed to charting the actual power produced. It should also be appreciated, as chart 200 contemplates the use of a plurality prediction process methods, including utilization of one or more additional power prediction processes either within the disclosure or other known or to be developed power generation prediction processes, periodic report 200 may serve the function of comparing and contrasting the effectiveness of processes for power generation prediction.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art.

What is claimed:

1. A method for calculating potential power generation for a wind farm, the wind farm including a plurality of wind turbines, the method comprising the steps of:
   measuring the power generated by said wind farm;
   acquiring turbine data from at least a subset of the plurality of wind turbines, the wind turbine data including local wind speed and power generated at the local wind speed;
   acquiring air density data;
   generating a power curve from the turbine data and the air density data, the power curve plotting the relationship between wind speed and power generated;
   calculating power lost due to availability, subcurve, and curtailment, the power loss calculated for at least said subset of turbines; and
   aggregating the power lost in order to determine an aggregate power loss for the wind farm.

2. The method of claim 1, further comprising generating a report charting the power generated by the wind farm and the power loss by the wind farm for a specified time interval.

3. The method of claim 1, further comprising calculating power loss due to the conversion from mechanical energy generated by the plurality of turbines into electrical power.

4. The method of claim 1, further comprising identifying inefficient data points of said turbine data and wind resource data, the inefficient data points including turbine data and wind resource data associated with a turbine operating at a power generation efficiency level below a pre-determined power generation efficiency level; and filtering the inefficient data points prior to generating the power curve.

5. The method of claim 1, wherein the air density data is obtained locally or by accessing a regional weather database.

6. The method of claim 4, wherein the wind resource data is acquired using a numerical weather prediction model.

7. The method of claim 4, wherein missing wind speed data from the turbine data is backfilled using wind speed from the wind resource data.

8. The method of claim 4, wherein the wind resource data further comprises air density; and
   wherein generating a power curve from the turbine data and the air density data further comprises plotting the relationship between wind speed, air density and power generated.

9. The method of claim 1, wherein the turbine data is collected using a device provided proximate to each wind turbine of the wind farm.

10. The method of claim 1, wherein the potential power generation comprises the sum of the power lost and the power generated.

11. A system for calculating potential power generation for a wind farm, the wind farm including a plurality of wind turbines, the system comprising:
- a module for measuring the power generated by said wind farm;
- a module for acquiring turbine data from at least a subset of the plurality of wind turbines, the wind turbine data including local wind speed and power generated at the local wind speed;
- a module for acquiring air density data;
- a module for generating a power curve from the turbine data and air density data, the power curve plotting the relationship between wind speed and power generated;
- a module for calculating power lost due to availability, subcurve, and curtailment, the power loss calculated for at least said subset of turbines; and
- a module for aggregating the power lost in order to determine an aggregate power loss for the wind farm.

12. The system of claim 11, further comprising a module for generating a report charting the power generated by the wind farm and the power loss by the wind farm for a specified time interval.

13. The system of claim 11, further comprising a module for calculating power loss due to the conversion from mechanical energy generated by the plurality of turbines into electrical power.

14. The system of claim 11, further comprising a module for identifying inefficient data points of said turbine data and wind resource data, the inefficient data points including turbine data and wind resource data associated with a turbine operating at a power generation efficiency level below a pre-determined power generation efficiency level; and a module for filtering the inefficient data points prior to generating the power curve.

15. The system of claim 14, wherein missing wind speeds from the turbine data is backfilled using wind speed from the wind resource data.

16. The system of claim 14, wherein the wind resource data further comprises air density;
- and wherein the module for generating a power curve from the turbine data and the wind resource data further plots the relationship between wind speed, air density and power generated.

17. The system of claim 11, wherein the air density data is obtained locally or by accessing a regional weather database.

18. The system of claim 14, wherein the wind resource data is acquired using a numerical weather prediction model.

19. The system of claim 11, wherein the turbine data is collected using a device provided proximate to each wind turbine of the wind farm.

20. The system of claim 11, wherein the potential power generation comprises the sum of the power lost and the power generated.

* * * * *